US012803245B2

(12) United States Patent
Chen

(10) Patent No.: US 12,803,245 B2
(45) Date of Patent: Nov. 17, 2026

(54) LASERS WITH A COMPOSITE CAVITY OF TWO SEMICONDUCTORS

(71) Applicant: II-VI Delaware, Inc., Wilmington, DE (US)

(72) Inventor: Young-Kai Chen, New Providence, NJ (US)

(73) Assignee: II-VI DELAWARE, INC., Wilmington, DE (US)

(*) Notice: Subject to any disclaimer, the term of this patent is extended or adjusted under 35 U.S.C. 154(b) by 604 days.

(21) Appl. No.: 18/221,242

(22) Filed: Jul. 12, 2023

(65) Prior Publication Data

US 2024/0022043 A1 Jan. 18, 2024

Related U.S. Application Data

(60) Provisional application No. 63/389,468, filed on Jul. 15, 2022.

(51) Int. Cl.
*H01S 5/10* (2021.01)
*H01S 5/125* (2006.01)

(52) U.S. Cl.
CPC ............ *H01S 5/1021* (2013.01); *H01S 5/125* (2013.01)

(58) Field of Classification Search
CPC .................................................... H01S 5/1021
See application file for complete search history.

(56) References Cited

U.S. PATENT DOCUMENTS 5,231,642 A 7/1993 Scifres et al.
6,060,723 A 5/2000 Nakazato et al.
6,567,454 B1 5/2003 Fischer et al.
7,333,691 B1 2/2008 Gill et al.
7,501,294 B1 3/2009 Nakagawa
7,953,135 B2 5/2011 Onishi
(Continued)

FOREIGN PATENT DOCUMENTS

CN 111817131 A 10/2020
EP 2463694 6/2012
(Continued)

OTHER PUBLICATIONS https://en.wikipedia.org/wiki/Silicon (Year: 2026).*
(Continued)

*Primary Examiner* — Minsun O Harvey
(74) *Attorney, Agent, or Firm* — McAndrews, Held & Malloy, Ltd.

(57) ABSTRACT

A laser may include a lower semiconductor structure and an upper semiconductor structure. The lower semiconductor structure may include a lower waveguide along a top side of the lower semiconductor structure. The upper semiconductor structure may include an upper waveguide along a bottom side of the upper semiconductor structure. The upper semiconductor structure may be positioned over the top side of the lower semiconductor structure such that a first portion of the upper waveguide vertically overlaps a second portion of the lower waveguide. A coupler between the upper waveguide and the lower waveguide may couple optical energy of the upper waveguide to the lower waveguide. The lower waveguide may comprise semiconductor material having a wider bandgap than semiconductor material of the upper waveguide.

20 Claims, 3 Drawing Sheets

(56) References Cited

U.S. PATENT DOCUMENTS

| | | | |
|---|---|---|---|
| 10,008,826 B1 | 6/2018 | Padullaparthi | |
| 10,473,858 B1 | 11/2019 | Mahgerefteh et al. | |
| 10,707,650 B2 | 7/2020 | Ghosh et al. | |
| 11,303,098 B1 | 4/2022 | Tandoi | |
| 11,757,256 B2 | 9/2023 | Tandoi | |
| 2005/0002430 A1 | 1/2005 | Ryou | |
| 2006/0133754 A1 | 6/2006 | Patel et al. | |
| 2007/0145388 A1 | 6/2007 | Philippens et al. | |
| 2007/0153867 A1 | 7/2007 | Muller | |
| 2008/0197289 A1 | 8/2008 | Muller | |
| 2010/0086255 A1 | 4/2010 | Ishizaka | |
| 2010/0150500 A1 | 6/2010 | Pyo et al. | |
| 2013/0264544 A1 | 10/2013 | Karg et al. | |
| 2014/0233881 A1 | 8/2014 | Hatori et al. | |
| 2016/0131837 A1 | 5/2016 | Mahgerefteh et al. | |
| 2017/0199330 A1 | 7/2017 | Doany et al. | |
| 2017/0207600 A1* | 7/2017 | Klamkin | H01S 5/142 |
| 2018/0013264 A1* | 1/2018 | Tanaka | H01S 5/0612 |
| 2018/0059324 A1 | 3/2018 | Tu et al. | |
| 2018/0231714 A1 | 8/2018 | Collins | |
| 2018/0314005 A1 | 11/2018 | Lin et al. | |
| 2020/0106242 A1 | 4/2020 | Kalifa et al. | |
| 2020/0174194 A1 | 6/2020 | Kojima et al. | |
| 2020/0335942 A1 | 10/2020 | Carson et al. | |
| 2021/0336420 A1 | 10/2021 | Tandoi | |
| 2022/0320813 A1* | 10/2022 | Yamaoka | H01S 5/021 |

FOREIGN PATENT DOCUMENTS

| | | | |
|---|---|---|---|
| EP | 2463694 A1 * | 6/2012 | H01S 5/12 |
| JP | 2008064910 | 3/2008 | |
| JP | 2012074411 A | 4/2012 | |
| JP | 2012151327 | 8/2012 | |
| WO | 2010100738 | 9/2012 | |
| WO | 2020245935 | 12/2020 | |

OTHER PUBLICATIONS https://en.wikipedia.org/wiki/Indium_arsenide (Year: 2026).*

Japanese Office Action for Application No. 2023-116239, dated Nov. 5, 2024, 8 pages.

Extended European Search Report for EP23185851, dated Nov. 24, 2023, 8 pages.

Japanese Office Action for Application No. 2023-116239, dated Jun. 5, 2024, 8 pages.

Japan Patent Office, Office Action, Appln. No. 2025-023091, dated Apr. 17, 2026, 4 pages.

Chinese Office Action and Search Report for CN Patent Application No. 202310878683X dated Aug. 20, 2026.

* cited by examiner

LASERS WITH A COMPOSITE CAVITY OF TWO SEMICONDUCTORS

This application is a non-provisional and claims benefit to U.S. Provisional Patent Application Ser. No. 63/389,468, filed on Jul. 15, 2022, the entire contents of which is hereby incorporated herein by reference in its entirety.

TECHNICAL FIELD

The present disclosure generally relates to laser devices.

BACKGROUND

A vertical-cavity surface-emitting laser (VCSEL) has a laser cavity that is sandwiched between and defined by two mirror stacks. A VCSEL is typically fabricated on a semiconductor substrate (in many cases a GaAs or InP substrate), with a bottom mirror stack formed on the top surface of the substrate, and then covered by the laser cavity and top mirror stack. Each mirror stack includes a number of epitaxial layers of alternating refractive index values (e.g., alternating between "high" and "low" refractive index values). The cavity region itself includes an active region, which may be formed, for example, by one or more quantum well structures. As light passes from a layer of one index of refraction to another, a portion of the light is reflected, creating a diffractive Bragg reflector (DBR) structure. By using a sufficient number of alternating layers, a high percentage of light is reflected and creates a standing wave pattern across the cavity.

BRIEF SUMMARY OF THE DISCLOSURE

Shown in and/or described in connection with at least one of the figures, and set forth more completely in the claims are lasers with a composite cavity of two semiconductors.

These and other advantages, aspects and novel features of the present disclosure, as well as details of illustrated embodiments thereof, will be more fully understood from the following description and drawings.

BRIEF DESCRIPTION OF THE DRAWINGS

The various features and advantages of the present disclosure may be more readily understood with reference to the following detailed description taken in conjunction with the accompanying drawings, wherein like reference numerals designate like structural elements.

DESCRIPTION

Figure 1:
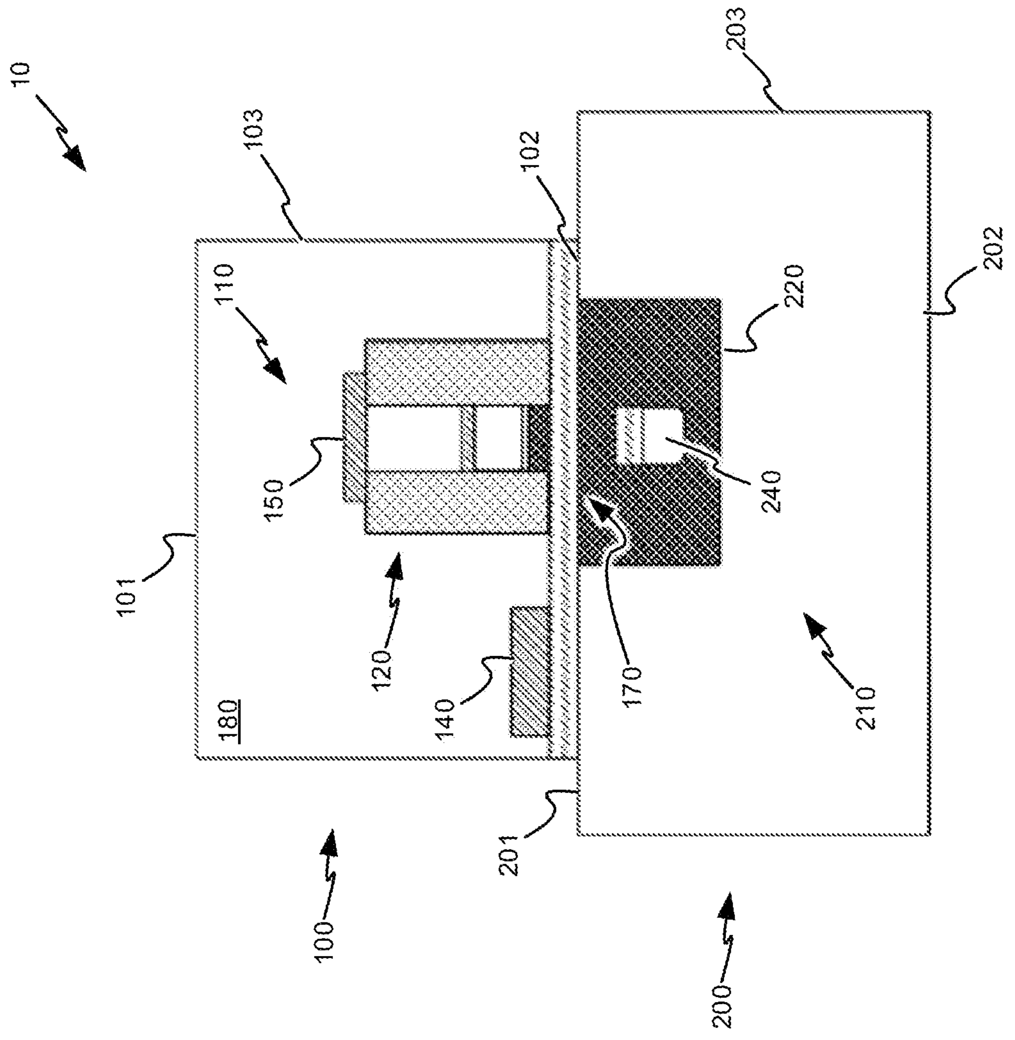
FIG. 1 shows a cross-section view of a vertical coupler section of a laser comprising a composite cavity of two semiconductors.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion. Elements numbered with an apostrophe (') can be similar to correspondingly numbered elements without an apostrophe.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

A composite cavity laser (CCL) includes a composite lasing cavity that is composed of a cavity from two semiconductor materials. The CCL may be fabricated using a pair of two semiconductor structures, with a top portion of the cavity formed via an upper structure comprising semiconductor material (e.g., a GaAs or InP) having a narrow bandgap energy, and a bottom portion of cavity formed via a lower structure comprising semiconductor material (e.g., a SiC, AlN, or diamond) having a wide bandgap energy. The cavity portions may be coupled together via a coupler (e.g., a vertical grating coupler (VGC) or an evanescent tapered coupler (ETC)). The upper portion of the cavity may provide gain and distributed mirrors (e.g., grating sections to form a distributed feedback structure or distributed Bragg reflector structure) for active lasing action in the narrow bandgap semiconductor. The coupler may guide the lasing light or other optical energy generated by the upper portion of the cavity into the lower portion of the cavity. The lower portion of the cavity may provide a lower low loss waveguide to an output facet of the lower structure. The upper lasing portions of the CCL may be formed, for example, by one or more quantum well structures.

Figure 2:
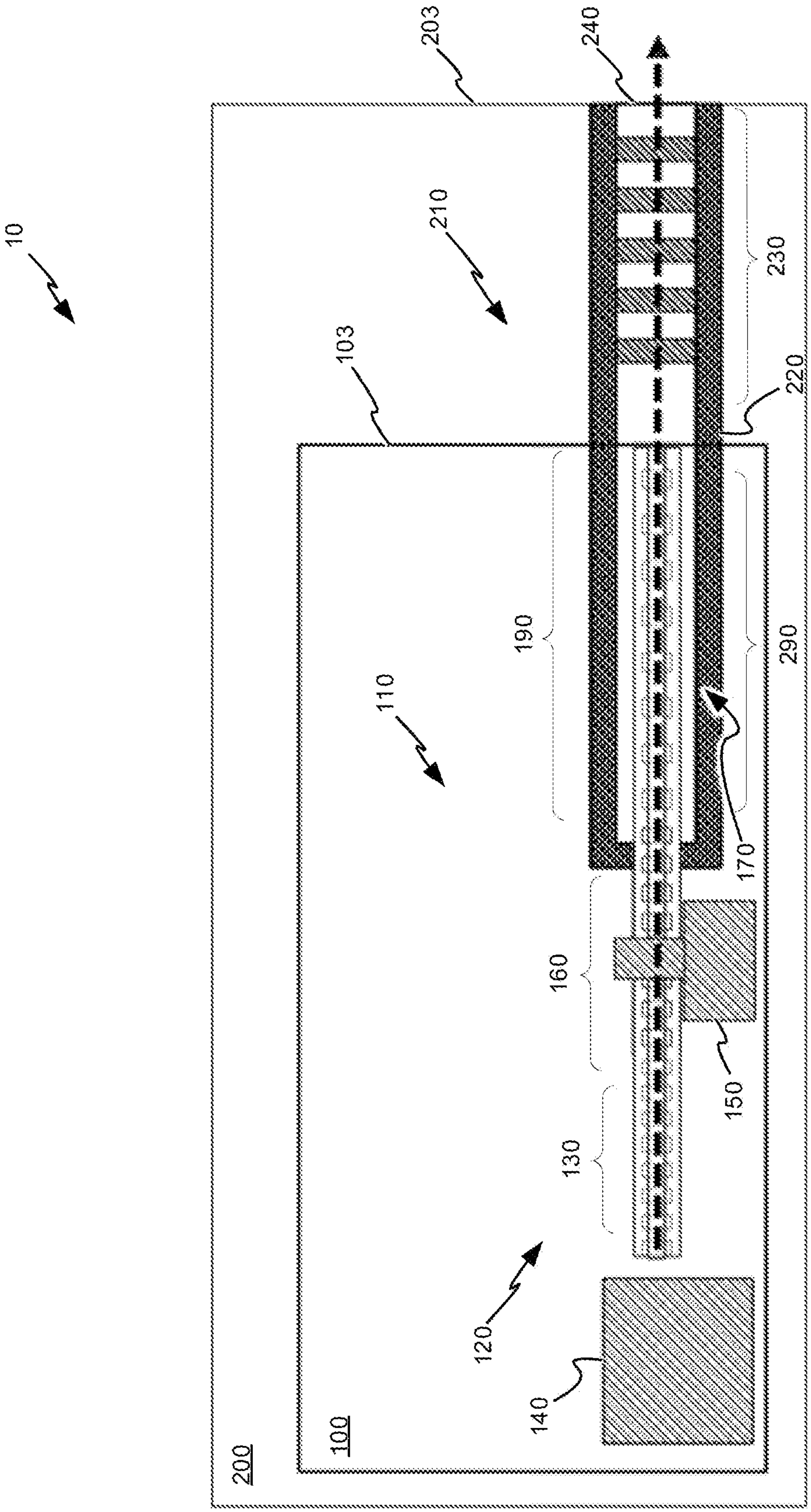
FIG. 2 shows a top view of the laser depicted in FIG. 1 comprising a composite cavity of two semiconductors.
Figure 3:
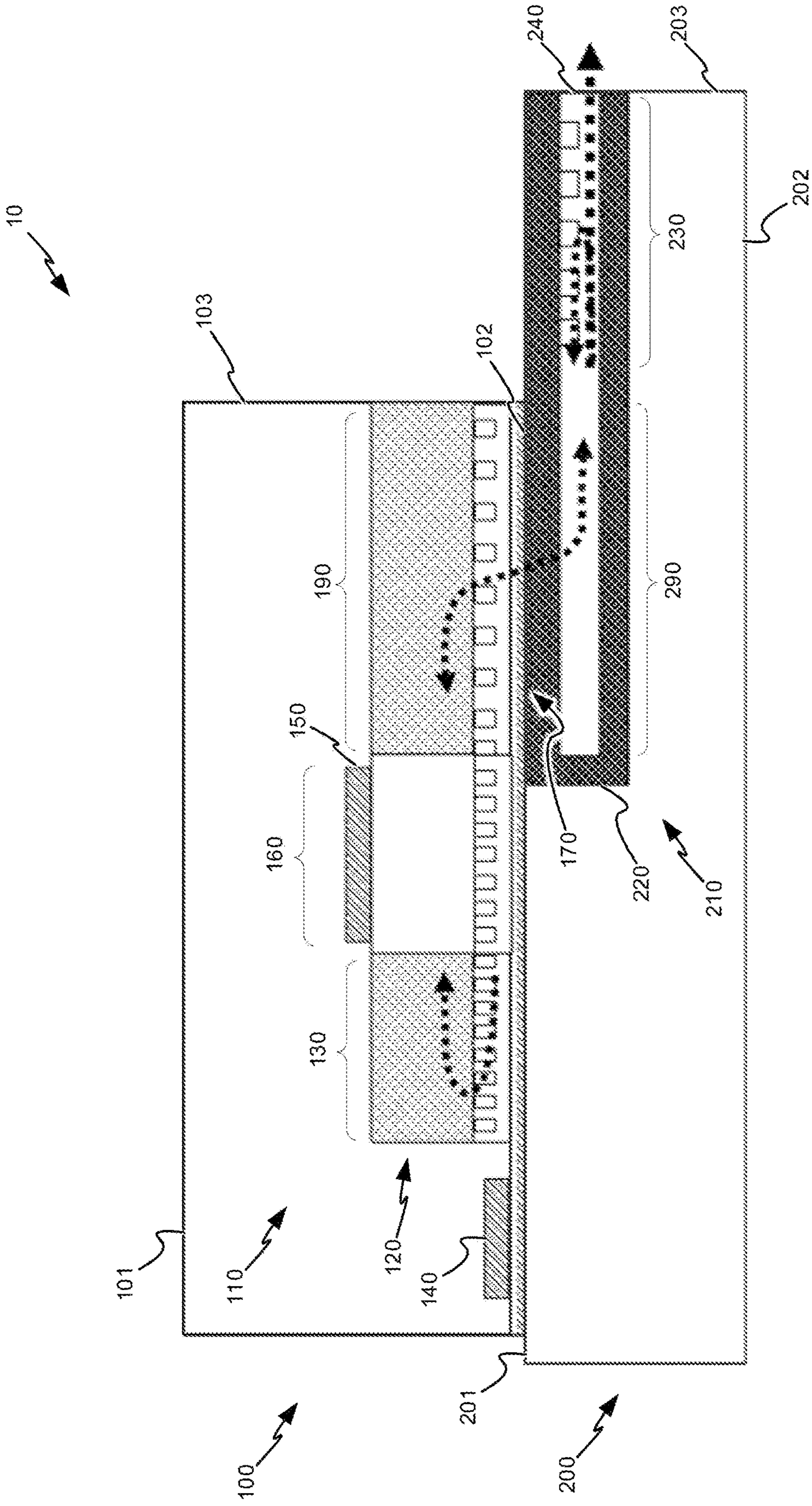
FIG. 3 shows a side view of the laser depicted in FIG. 1 comprising a composite cavity of two semiconductors.

FIGS. 1-3 depict an embodiment of a laser 10. The laser 10 may be implemented as a composite cavity laser (CCL) in which two semiconductor structures 100, 200 comprising semiconductor materials of differing bandgaps are integrated together. In particular, the laser 10 may comprise an upper semiconductor structure 100 providing an upper cavity 110 formed using a first semiconductor material and a lower semiconductor structure 200 providing a lower cavity 210 formed using a second semiconductor material that has a wider bandgap than the first semiconductor material.

The upper semiconductor structure 100 may comprise an upper structure top side 101, an upper structure bottom side 102, and upper structure lateral sides 103 between the upper structure top side 101 and the upper structure bottom side 102. Similarly, the lower semiconductor structure 200 may comprise a lower structure top side 201, a lower structure bottom side 202, and lower structure lateral sides 203 between the lower structure top side 201 and the lower structure bottom side 202.

The upper cavity 110 of the upper semiconductor structure 100 may be formed from a first semiconductor material or a first semiconductor substrate have a first bandgap. The lower cavity 210 of the lower semiconductor structure 200 may be formed from a second semiconductor material or a second semiconductor substrate having a second bandgap that is greater or wider than the first bandgap. Due to such differences in bandgap, the upper semiconductor structure 100 may be referred to herein as the narrow bandgap (NBG) structure 100 and the lower semiconductor structure 200 may be referred to herein as the wide bandgap (WBG) structure 200. In operation, the NBG structure 100 may provide gain, lasing, and vertical coupling functions. The WBG structure 200 may provide cooling, waveguiding, and photonic functions.

As shown, the NBG structure 100 may comprise an upper waveguide 120 along a bottom side 102 of the NBG structure 100. The upper waveguide 120 may include one or more lasing structures such as a distributed Bragg reflector (DBR) structure or a distributed feedback (DFB) structure. As depicted, the upper waveguide 120 comprises a DBR structure 130 between a first contact 140 (e.g., an n-contact) and a second contact 150 (e.g., a p-contact). The upper waveguide 120 of the NBG structure 100 may further include the DFB structure 160 between the DBR structure 130 of the upper waveguide 120 and a coupler 170. The NBG structure 100 may further comprise a dielectric 180 that encapsulates the upper waveguide 120 and contacts 140, 150. As shown, the dielectric 180 may provide and/or define the upper structure top side 101 and the upper structure lateral sides 103.

The WBG structure 200 may comprise a lower waveguide 220 along a top side of the WBG structure 200. The lower waveguides 220 may be buried in the top side of the lower semiconductor structure 200. The WBG structure 200 may also include an optional DBR structure 230 between the lower waveguide 220 and an output facet 240 of the WBG structure 200.

As shown, the upper structure bottom side 102 may be coupled to, formed on, or otherwise engaged with the lower structure top side 201. Moreover, the upper waveguide 120 may be positioned over the lower waveguide 220 of the WBG structure 200 such that a first portion 190 of the upper waveguide 120 vertically overlaps with a second portion 290 of the lower waveguide 220.

The coupler 170 may be incorporated into the overlapping portions of the upper waveguide 120 and the lower waveguide 220 and/or positioned between the overlapping portions 190, 290 of the upper waveguide 120 and the lower waveguide 220. The coupler 170 may couple lasing light and/or other optical energy from the first portion 190 of the upper waveguide 120 to the second portion 290 of the lower waveguide 220 of the WBG structure 200.

To this end, the coupler 170 may include a vertical grating coupler (VGC) in one or more surfaces of the upper waveguide 120. The VGC may include a vertical grating that couples optical energy of the upper waveguide 120 to the lower waveguide 220 via the overlapping portions 190, 290 of the upper waveguide 120 and the lower waveguide 220. Alternatively, the coupler 170 may include an evanescent taper coupler (ETC) at one or more tapered portions 190, 290 of the upper waveguide 120 and/or lower waveguide 220. The ETC may couple optical energy of the upper waveguide 120 to the lower waveguide 220 without the aid of gratings. Regardless, the coupler 170 (e.g., VGC or ETC) may serve as an intra-cavity optical connection between the upper waveguide 120 of the NBG structure 100 and the lower waveguide 220 of the WBG structure 200. In this manner, the laser 10 of FIGS. 1-3 may form a composite laser cavity having an upper cavity 110 and a lower cavity 210 formed from semiconductors with differing bandgaps.

As noted, the upper cavity 110 may be implemented with semiconductor material having a narrower bandgap than semiconductor material used to implement the lower cavity 210. In particular, the upper cavity 110 may be implemented with narrow bandgap semiconductor materials such as, for example, InP, GaAs, or associated quantum wells using alloy layers. For example, the upper cavity 110 may be implemented with semiconductor materials having a bandgap of about 1.34 eV, of about 1.42 eV, of less than 2 eV, of less than 3 eV, or within a range between any two of the preceding values. In various embodiments, the upper cavity 110, the DBR structure 130, the DFB structure 160, and the coupler 170 may be implemented in a similar manner to typical semiconductor laser structures but with very thin lower cladding layer thickness (e.g., less than 1 micron). The very thin lower cladding layer thickness may efficiently transfer heat to the lower semiconductor structure 200, which may exhibit higher thermal conductivity.

In various embodiments, the WBG structure 200 and its lower cavity 210 may be implemented with wide bandgap semiconductor materials or substrates such as, for example, SiC, AlN, diamond, etc. For example, the WBG structure 200 may be implemented with a semiconductor material having a bandgap of about 3 eV, of about 3.3 eV, of about 5.47, of about 6.2, of greater than 3 eV, of greater than 5 eV, of greater than 6 eV, or within a range between any two of the preceding values. The lower waveguide 220 of the WBG structure 200 may guide lasing light or other optical energy from the upper waveguide 120 of the NBG structure 100 to an output facet 240 of the lower semiconductor structure 200.

The WBG structure 200 may establish a composite laser cavity through the coupler 170 of the NBG structure 100 with its own coupler or partial-reflective output facet. Moreover, the WBG structure 200 may provide better thermal removal of heat from NBG structure 100 for higher optical power and efficiency. The lower waveguide 220 of the WBG structure 200 may provide a lower refractive index than a refractive index of the upper waveguide 120. The lower refractive index may provide a larger optical mode at the output facet 240 and may permit a lower loss coupling with an external optical fiber in comparison to the upper waveguide 120. The lower refractive index of the lower waveguide 220 may also enhance reliability at high optical power at the output facet 240 with less optical damage generated by reduced density. The lower waveguide 220 of the WBG structure 200 may also provide an optical power combiner that combines different emitting wavelengths from multiple NBG structures 100 to form a multi-color laser emitter.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A laser comprising:

an upper semiconductor substrate comprising an upper semiconductor substrate top side, an upper semiconductor substrate bottom side, an upper waveguide, and one or more lasing structures, wherein the upper waveguide comprises a first semiconductor material having a first bandgap;

a lower semiconductor substrate comprising a lower semiconductor substrate top side, a lower semiconductor substrate bottom side, a lower waveguide between the upper waveguide and an output, wherein the lower waveguide comprises a second semiconductor material having a second bandgap that is wider than the first bandgap;

a cladding layer between the upper semiconductor substrate bottom side and the lower semiconductor substrate top side, wherein the cladding layer physically couples the upper waveguide to the lower waveguide; and a coupler between the upper waveguide and the lower waveguide that couples optical energy of the upper waveguide to the lower waveguide through the cladding layer.

2. The laser of claim 1, wherein the one or more lasing structures comprises a distributed Bragg reflector (DBR) structure.

3. The laser of claim 1, wherein the one or more lasing structures comprises a distributed feedback (DFB) structure.

4. The laser of claim 1, wherein the coupler comprises a vertical grating coupler on a surface of the upper waveguide.

5. The laser of claim 1, wherein:

a first portion of the upper waveguide overlaps and is physically coupled to a second portion of the lower waveguide; and the coupler optically couples the upper waveguide to the lower waveguide via the overlapping and physically coupled first and second portions of the upper waveguide and the lower waveguide.

6. The laser of claim 1, wherein:

the first bandgap of the first semiconductor material is less than 2 eV; and the second bandgap of the second semiconductor material is greater than 3 eV.

7. The laser of claim 1, wherein:

the first bandgap of the first semiconductor material is between 1.34 eV and 2 eV; and the second bandgap of the second semiconductor material is between 3 eV and 6 eV.

8. A laser comprising:

a lower semiconductor substrate having a lower semiconductor substrate top side, a lower semiconductor substrate bottom side, and lower semiconductor substrate lateral sides between the lower semiconductor substrate top side and the lower semiconductor substrate bottom side, wherein the lower semiconductor substrate comprises a lower waveguide that extends along the lower semiconductor substrate top side;

an upper semiconductor substrate having an upper semiconductor substrate top side, an upper semiconductor substrate bottom side, and upper semiconductor substrate lateral sides between the upper semiconductor substrate top side and the upper semiconductor substrate bottom side, wherein the upper semiconductor substrate comprises an upper waveguide that extends along the upper semiconductor substrate bottom side, and wherein the upper semiconductor substrate is positioned over the lower semiconductor substrate top side such that a first portion of the upper waveguide vertically overlaps a second portion of the lower waveguide; and a coupler between the upper waveguide and the lower waveguide that couples optical energy of the upper waveguide to the lower waveguide through a physical coupling between the upper waveguide and the lower waveguide; and wherein the lower waveguide comprises semiconductor material having a wider bandgap than semiconductor material of the upper waveguide.

9. The laser of claim 8, wherein the upper waveguide comprises one or more lasing structures.

10. The laser of claim 8, wherein the upper waveguide comprises a distributed Bragg reflector (DBR) structure.

11. The laser of claim 8, wherein the upper waveguide comprises a distributed feedback (DFB) structure.

12. The laser of claim 8, wherein the coupler comprises a vertical grating coupler on a surface of the upper waveguide.

13. The laser of claim 8, wherein the coupler couples the upper waveguide to the lower waveguide via the overlapping first portion and second portion.

14. The laser of claim 8, wherein:

the semiconductor material of the upper waveguide has a first bandgap of less than 2 eV; and the semiconductor material of the lower waveguide has a second bandgap of greater than 3 eV.

15. The laser of claim 8, wherein:

the semiconductor material of the upper waveguide has a first bandgap between 1.34 eV and 2 eV; and the semiconductor material of the lower waveguide has a second bandgap between 3 eV and 6 eV.

16. A laser comprising:

a wide bandgap (WBG) structure comprising a lower waveguide along a top side of the WBG structure;

a narrow bandgap (NBG) structure over the WBG structure, wherein the NBG structure comprises an upper waveguide along a bottom side of the NBG structure and coupled to the lower waveguide of the WBG structure via a physical coupling; and a coupler between the upper waveguide and the lower waveguide that couples optical energy of the upper waveguide to the lower waveguide through the physical coupling; and wherein the WBG structure has a wider bandgap than the NBG structure.

17. The laser of claim 16, wherein the NBG structure comprises one or more lasing structures that provide the upper waveguide with lasing light.

18. The laser of claim 17, wherein the one or more lasing structures comprise a distributed Bragg reflector (DBR) structure and a distributed feedback (DFB) structure.

19. The laser of claim 16, wherein the coupler comprises a vertical grating coupler.

20. The laser of claim 16, wherein:

the NBG structure has a first bandgap of less than 2 eV; and the WBG structure has a second bandgap of greater than 3 eV.

* * * * *